United States Patent
Zhu et al.

(10) Patent No.: US 7,666,774 B2
(45) Date of Patent: Feb. 23, 2010

(54) CMOS STRUCTURE INCLUDING DUAL METAL CONTAINING COMPOSITE GATES

(75) Inventors: Huilong Zhu, Poughkeepsie, NY (US); Dae-Gyu Park, Poughquag, NY (US); Zhijiong Luo, Carmel, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 11/625,984

(22) Filed: Jan. 23, 2007

(65) Prior Publication Data

US 2008/0173946 A1    Jul. 24, 2008

(51) Int. Cl.
    *H01L 21/8238*    (2006.01)
(52) U.S. Cl. .............................. 438/592; 257/E21.637; 438/199
(58) Field of Classification Search .................. 257/213, 257/288, 365, 368, 369, 386, 387, 388, E21.632, 257/E21.635, E21.637; 438/584, 597, 652, 438/656, 685, 686, 142, 147, 199, 585, 592
    See application file for complete search history.

(56) References Cited

U.S. PATENT DOCUMENTS

| | | | |
|---|---|---|---|
| 5,356,821 A * | 10/1994 | Naruse et al. ................ 438/234 |
| 5,661,043 A * | 8/1997 | Rissman et al. ............. 438/162 |
| 5,736,922 A * | 4/1998 | Goode et al. ................ 340/974 |
| 6,335,534 B1 * | 1/2002 | Suguro et al. .......... 250/492.21 |
| 6,373,112 B1 | 4/2002 | Murthy et al. |
| 6,524,902 B2 | 2/2003 | Rhee et al. |
| 6,746,943 B2 | 6/2004 | Takayanagi et al. |
| 6,794,234 B2 | 9/2004 | Polishchuk et al. |
| 6,809,017 B2 | 10/2004 | Arghavani et al. |
| 6,884,705 B2 | 4/2005 | Rhee et al. |
| 2005/0128843 A1 * | 6/2005 | Kajimoto et al. ............. 365/205 |
| 2006/0019437 A1 * | 1/2006 | Murto et al. ................. 438/199 |
| 2007/0048946 A1 * | 3/2007 | Ramaswamy et al. ....... 438/283 |

OTHER PUBLICATIONS

Park, et al., "Thermally robust dual-work function ALD-MNx MOSFETs using conventional CMOS process flow", IBM Semiconductor Research and Development Center (SRDC); Microelectronics Division, Hopewell Junction, NY, VLSI Dig. (2004).

* cited by examiner

*Primary Examiner*—Sue Purvis
*Assistant Examiner*—Kevin Quinto
(74) *Attorney, Agent, or Firm*—Scully, Scott, Murphy & Presser, P.C.; Louis J. Percello, Esq.

(57) ABSTRACT

A CMOS structure and a method for fabricating the CMOS structure include a first transistor located within a first semiconductor substrate region having a first polarity. The first transistor includes a first gate electrode that includes a first metal containing material layer and a first silicon containing material layer located upon the first metal containing material layer. The CMOS structure also includes a second transistor located within a laterally separated second semiconductor substrate region having a second polarity that is different than the first polarity. The second transistor includes a second gate electrode comprising a second metal containing material layer of a composition that is different than the first metal containing material layer, and a second silicon containing material layer located upon the second metal containing material layer. The first silicon containing material layer and the first semiconductor substrate region comprise different materials. The second silicon containing material layer and the second semiconductor substrate region also comprise different materials.

14 Claims, 4 Drawing Sheets

CMOS STRUCTURE INCLUDING DUAL METAL CONTAINING COMPOSITE GATES

FIELD OF THE INVENTION

The invention relates generally to complementary metal oxide semiconductor (CMOS) structures. More particularly, the invention relates to CMOS structures with enhanced performance and/or reduced power consumption.

DESCRIPTION OF THE RELATED ART

CMOS structures are complementary doped field effect transistor structures that are used in mated pairs within integrated circuits. CMOS structures are desirable insofar as CMOS structures are generally readily fabricated, and CMOS structures also generally provide for comparatively low power consumption within an integrated circuit.

A recent trend within CMOS structure fabrication has been the design and engineering of CMOS transistor gate electrodes and gate dielectrics to provide improved performance or reduced power consumption within CMOS devices. The design and engineering of CMOS transistor gate electrodes and gate dielectrics is typically intended to be directed towards modifying parameters such as work functions of gate electrodes and permittivities of gate dielectrics of a CMOS structure. Particularly, it is desired for threshold voltage design of an nMOSFET that a work function of a gate electrode thereof is close to an edge of a conduction-band of a semiconductor substrate that is used to fabricate the nMOSFET. Similarly, it is desired for threshold voltage design of a pMOSFET that a work function of a gate electrode thereof is near to an edge of a valence-band of the semiconductor substrate that is used to fabricate the pMOSFET. Since a conduction-band and a valence-band are separated in semiconductors, it is necessary to use different metallic gate electrodes that have different values of work functions to meet the requirements of the threshold voltage design for nMOSFET and pMOSFET, separately. Therefore, different metals are used to form nMOSFET and pMOSFET gate electrodes separately in order to provide different work functions or threshold voltages within a CMOS structure.

Various field effect transistor structures and methods for fabrication thereof, including CMOS structures and methods for fabrication thereof, are known in the semiconductor fabrication art.

For example, Park et al., in "Thermally robust dual-work function ALD-MNx MOSFETs using conventional CMOS process flow," VLSI Dig. (2004), teaches a CMOS device having enhanced electrical properties. The CMOS device realizes the foregoing result by using a tantalum nitride metal material for fabricating an n-FET gate within the CMOS device and a tungsten nitride metal material for fabricating a p-FET gate within the CMOS device.

Also, Murthy et al., in U.S. Pat. No. 6,373,112, teaches a field effect transistor structure absent degradation of a gate oxide, and a method for fabricating such a field effect transistor structure. The method and the resulting structure realize the foregoing result by using an ultra-thin silicon seed layer upon the gate oxide for purposes of growing a silicon-germanium alloy gate electrode thereupon.

In addition, Rhee et al., in U.S. Pub. No. 2002/0113294, teaches a CMOS device that provides for inhibited dopant depletion within a pair of differently doped gate electrodes within the CMOS device, and a method for fabricating the CMOS device. To realize the foregoing result, the CMOS device uses differently doped gate electrodes comprising a silicon-germanium alloy material, but with differing concentration gradients of germanium within the silicon-germanium alloy gate electrodes.

Similarly, Rhee et al., in U.S. Pub. No. 2004/0012055, teaches a field effect transistor including a gate electrode comprising a polysilicon/polysilicon-germanium alloy stack absent diffusion of germanium. The invention realizes the foregoing result by fabricating the polysilicon/polysilicon-germanium alloy stack using a lower polysilicon-germanium alloy layer having a columnar structure and an upper polysilicon layer having a random crystal structure.

Further, Takayanagi et al., in U.S. Pat. No. 6,746,943, teaches a CMOS device that compensates for differences in activation of p and n dopants within polysilicon-germanium alloy gate electrodes. The invention realizes the foregoing result by using different germanium concentrations within p and n doped gate electrodes within the CMOS device.

Similarly, Lin et al., in TW 423118 teaches a polysilicon-germanium alloy gate electrode CMOS device that may be optimized absent additional masking layers. The polysilicon-germanium alloy gate electrode CMOS device realizes the foregoing result by using differing germanium concentrations within a pair of polysilicon-germanium alloy gate electrodes.

Still further, Polishchuk et al., in U.S. Pat. No. 6,794,234, teaches a CMOS structure having differing work functions for nFET and pFET gate electrodes within the CMOS structure. To realize the foregoing result, one gate electrode within the CMOS structure comprises a first metal, while a second gate electrode within the CMOS structure comprises a second metal located beneath an alloy of the first metal and the second metal.

Finally, Arghavani et al., in U.S. Pat. No. 6,809,017, teaches a field effect transistor having enhanced compatibility between a high dielectric constant gate dielectric material layer and a polysilicon gate electrode located thereupon. To realize the foregoing result, the polysilicon gate electrode is deposited absent a hydrogen impurity and subsequently treated to be conductive.

Semiconductor structure and device dimensions are certain to continue to decrease, and due to a relative ease in dimensional scaling thereof CMOS structures are likely to be of considerable importance in semiconductor fabrication. As a more specifically related consideration, a power consumption of a high performance CMOS device increases dramatically upon scaling since when a gate dimension of the CMOS device is scaled down, an equivalent oxide thickness (EOT) of a gate dielectric within the CMOS device must also be scaled down proportionally. Thus, desirable are CMOS structures that comprise CMOS devices having enhanced performance and/or reduced power consumption with novel insulator materials as gate dielectrics and novel metal materials as gate electrodes, and methods for fabrication thereof.

SUMMARY

The invention includes a CMOS structure and a method for fabricating the CMOS structure. The CMOS structure and the method include: (1) a first gate located upon a first gate dielectric over a first semiconductor substrate region of a first polarity, where the first gate comprises a first metal containing material layer and a first silicon containing material layer located upon the first metal containing material layer; and (2) a second gate located upon a second gate dielectric over a second semiconductor substrate region of a second polarity different than the first polarity, where the second gate comprises a second metal containing material layer and a second silicon containing material layer located upon the second metal containing material layer. The first metal containing material layer comprises a different metal containing material (and optionally a different thickness) than the second metal containing material layer. The first gate dielectric material and the second gate dielectric material may comprise different gate dielectric materials and different thicknesses. The first silicon containing material layer and the second silicon containing material layer comprise different materials, respectively, than first semiconductor substrate region and the second semiconductor substrate region.

A CMOS structure in accordance with the invention includes at least a first transistor located within a first semiconductor substrate region and having a first polarity. The first transistor includes a first gate electrode comprising a first metal containing material layer and a first silicon containing material layer located upon the first metal containing material layer. The CMOS structure also includes at least a second transistor located within a laterally separated second semiconductor substrate region and having a second polarity different than the first polarity. The second transistor includes a second gate electrode comprising a second metal containing material layer of composition different than the first metal containing material layer and a second silicon containing material layer located upon the second metal containing material layer. Within the CMOS structure, the first silicon containing material layer and the second silicon containing material layer each respectively have a composition different than the first semiconductor substrate region and the second semiconductor substrate region.

Another CMOS structure in accordance with the invention includes an NFET located over a first semiconductor substrate region and comprising a first gate electrode including a tantalum nitride material layer and a first silicon containing material layer located upon the tantalum nitride material layer. This other CMOS structure also includes a pFET located over a laterally separated second semiconductor substrate region and comprising a second gate electrode including a tungsten nitride material layer and a second silicon containing material layer located upon the tungsten nitride material layer. Within this other CMOS structure, the first silicon containing material layer and the second silicon containing material layer each respectively have a composition different than the first semiconductor substrate region and the second semiconductor substrate region.

A method in accordance with the invention includes forming over a first semiconductor substrate region having a first polarity a first gate electrode including a first metal containing material layer and a first silicon containing material layer located upon the first metal containing material layer. The method also includes forming over a laterally separated second semiconductor substrate region having a second polarity different than the first polarity a second gate electrode laterally separated from the first gate electrode. The second gate electrode includes a second metal containing material layer of a composition different than the first metal containing material layer and a second silicon containing material layer located upon the second metal containing material layer. The method finally includes forming into the first semiconductor substrate region and the second semiconductor substrate region a first pair of source/drain regions separated by the first gate electrode and a second pair of source/drain regions separated by the second gate electrode. Within the method, the first silicon containing material layer has a composition different than the first semiconductor substrate region and the second silicon containing material layer has a composition different than the second semiconductor substrate region.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DETAILED DESCRIPTION OF THE INVENTION

The present invention, which provides CMOS structures including dual metal containing composite gates and methods of fabricating the same, will now be described in greater detail.

Figure 1:
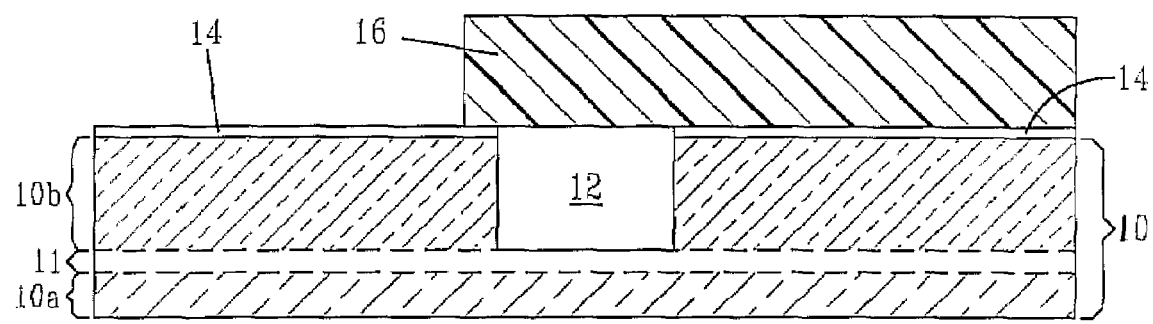
FIG. 1 to FIG. 10 show a series of schematic cross-sectional diagrams illustrating the results of progressive stages in fabricating a CMOS structure in accordance with an embodiment of the invention.

FIG. 1 shows a schematic cross-sectional diagram of a CMOS structure at an early stage in fabrication thereof in accordance with an embodiment of the invention. Specifically, FIG. 1 shows a CMOS structure including an isolation region 12 that is located embedded within a semiconductor substrate 10. A sacrificial layer 14 is located upon the semiconductor substrate 10 and contacting the isolation region 12. Finally, a first mask layer 16 is located upon the isolation region 12 and a portion (i.e., a right hand portion) of the sacrificial layer 14 while leaving exposed another portion (i.e., a left hand portion) of the sacrificial layer 14.

The semiconductor substrate 10 may comprise any of several semiconductor materials. Non-limiting examples include silicon, germanium, silicon-germanium alloy, silicon carbide, silicon-germanium carbide alloy and compound semiconductor materials. Non-limiting examples of compound semiconductor materials include gallium arsenide, indium arsenide and indium phosphide semiconductor materials. Typically, the semiconductor substrate 10 comprises a silicon or silicon-germanium alloy semiconductor material that has a thickness of about a few mm.

The isolation region 12 may comprise any of several dielectric isolation materials that are generally conventional in the semiconductor fabrication art. Non-limiting examples include oxides, nitrides and oxynitrides of silicon, as well as laminates thereof and composites thereof. Oxides, nitrides and oxynitrides of other elements are not excluded. The isolation region 12, independent of a material of composition of the isolation region 12, may be formed using any of several methods. Non-limiting examples include thermal or plasma oxidation or nitridation methods, chemical vapor deposition methods and physical vapor deposition methods. Typically, the isolation region 12 comprises at least in part a silicon oxide dielectric material. Typically, the isolation region 12 has a depth within the semiconductor substrate 10 from about 1000 to about 10000 angstroms and a linewidth within the semiconductor substrate from about 0.1 to about 0.5 microns.

The sacrificial layer 14 typically comprises a sacrificial dielectric material, although the instant embodiment is also operative when using a sacrificial semiconductor material or a sacrificial conductor material. The sacrificial dielectric material may be selected from the same group of dielectric materials from which may be comprised the isolation region 12. The sacrificial dielectric material may also be formed using the same or similar methods in comparison with the methods that are used for forming the isolation region 12. Typically, the sacrificial layer 14 comprises at least in part a silicon oxide sacrificial dielectric material that has a thickness from about 50 to about 500 angstroms. Such a silicon oxide sacrificial dielectric material may preferably be formed using a thermal oxidation method.

Finally, the first mask layer 16 comprises a mask material that may include, but is not limited to, a hard mask material or a photoresist mask material. Photoresist mask materials are more common. Photoresist mask materials may include, but are not limited to, positive photoresist materials, negative photoresist materials and hybrid photoresist materials. Typically, the first mask layer 16 comprises a photoresist material, typically either a positive photoresist material or a negative photoresist material that has a thickness from about 1000 to about 5000 angstroms. The photoresist material is typically deposited using otherwise generally conventional spin coating, photoexposure and development methods.

Although FIG. 1 illustrates the instant embodiment within the context of a bulk semiconductor substrate 10, neither the embodiment nor the invention is necessarily so limited. Rather, the embodiment also contemplates that alternative substrates may be used in addition to the semiconductor substrate 10 that comprises a bulk semiconductor substrate. One additional type of semiconductor substrate that may be used within the context of the embodiment is a semiconductor-on-insulator substrate that comprises a base semiconductor substrate, a buried dielectric layer located upon the base semiconductor substrate and a surface semiconductor layer located upon the buried dielectric layer.

Such a type of semiconductor-on-insulator substrate is illustrated within FIG. 1 when an optional buried dielectric layer 11 separates a base semiconductor substrate 10a portion of the semiconductor substrate 10 from a surface semiconductor layer 10b portion of the semiconductor substrate 10. The buried dielectric layer 11 may comprise any of the several dielectric materials from which is comprised the isolation region 12. Typically, the optional buried dielectric layer 11 has a thickness from about 100 to about 3000 angstroms. In addition, generally with respect to such a semiconductor-on-insulator substrate, the surface semiconductor layer 10b will have a thickness from about 50 to about 2000 angstroms. Also, the surface semiconductor layer 10b within the semiconductor-on-insulator substrate will not necessarily have the same dopant polarity, dopant concentration or crystallographic orientation as the base semiconductor substrate 10a within the semiconductor-on-insulator substrate.

A semiconductor-on-insulator semiconductor substrate may be fabricated using any of several methods. Included are layer transfer methods, layer lamination methods and separation by implantation of oxygen (SIMOX) methods.

Finally, the embodiment also contemplates the use of a hybrid orientation substrate in place of the bulk semiconductor substrate 10. Hybrid orientation substrates include multiple semiconductor regions of different crystallographic orientation.

Figure 2:
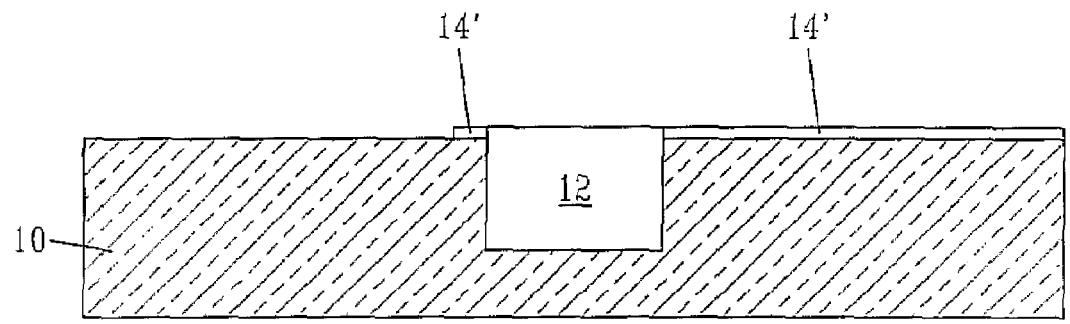

FIG. 2 shows the results of patterning a portion of the sacrificial layer 14 to form a sacrificial layer 14'. The sacrificial layer 14 may be patterned to form the sacrificial layer 14' while using methods and materials that are conventional in the semiconductor fabrication art. Included, but not limiting, are wet chemical etch methods, as well as dry plasma etch methods. In this particular instance wet chemical etch methods may under certain circumstances be preferred insofar as wet chemical etch methods are less likely to damage an exposed portion of the semiconductor substrate 10. When the sacrificial layer 14 comprises at least in part a silicon oxide material, the sacrificial layer 14 may be etched to form the sacrificial layer 14' while using an aqueous hydrofluoric acid containing etchant material. Alternatively, a dry plasma etch method using a fluorine containing etchant gas composition may also be used.

Figure 3:
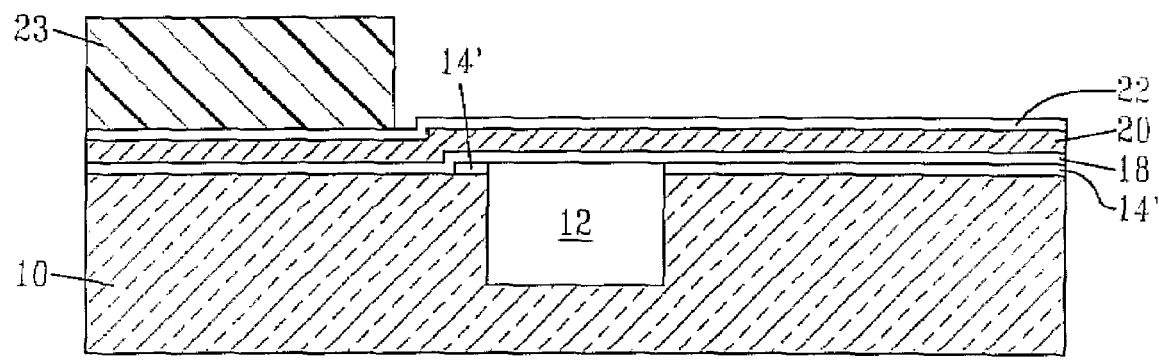

FIG. 3 shows a first gate dielectric 18 located upon the semiconductor structure of FIG. 2. FIG. 3 also shows a first metal containing material layer 20 located upon the first gate dielectric 18. FIG. 3 also shows a capping layer 22 located upon the first metal containing material layer 20. Finally, FIG. 3 also shows a second mask layer 23 located upon the capping layer 22 and also located over a portion of the semiconductor substrate 10 absent the sacrificial layer 14' interposed therebetween.

The first gate dielectric 18 may comprise any of several gate dielectric materials that are conventional in the semiconductor fabrication art. Non-limiting examples of gate dielectric materials include oxides, nitrides and oxynitrides of silicon that have a dielectric constant from about 4 to about 20, measured in vacuum. The first gate dielectric 18 may alternatively comprise a generally higher dielectric constant gate dielectric material having a dielectric constant from about 20 to at least about 100, also measured in vacuum. Non-limiting examples of these types of gate dielectric materials include hafnium oxides, hafnium silicates, titanium oxides, lanthanum oxides, barium-strontium-titantates (BSTs) and lead-zirconate-titanates (PZTs). The gate dielectric materials may be formed using methods that are appropriate to their materials of composition. Non-limiting examples include thermal or plasma oxidation or nitridation methods, chemical vapor deposition methods (including atomic layer chemical vapor deposition methods) and physical vapor deposition methods (including sputtering methods). Within the embodiment, the first gate dielectric 18 preferably comprises a hafnium oxide gate dielectric material, or a related higher dielectric constant gate dielectric material, that has a thickness from about 20 to about 50 angstroms. Generally, it is preferred that the first gate dielectric 18 is comprised of an oxide, such as $SiO_2$, $HfO_2$, $ZrO_2$, $Al_2O_3$, $TiO_2$, $La_2O_3$, $SrTiO_3$, $LaAlO_3$, and mixtures thereof.

The first metal containing material layer 20 comprises a first metal containing material that is specifically selected and engineered to provide an appropriate work function (or alternative performance parameter) for a gate electrode within a metal oxide semiconductor field effect transistor that is to be formed to the left of the isolation region 12 incident to her processing of the semiconductor structure of FIG. 3. The first metal containing material layer 20 may comprise any of several base metals, metal alloys and metal nitrides. Included but not limiting are base metals, metal alloys and metal nitrides of tantalum and tungsten. Also included are metal interdiffusion systems (i.e., metal containing material compositions) that selectively alloy a metal gate layer to achieve a suitable workfunction value for an nMOS or a pMOS gate. Such interdiffusion systems may include, but are not limited to titanium/nickel (Ti/Ni), hafnium/molybdenum (Hf/Mo), ruthenium/tantalum (Ru/Ta), and platinum/tantalum (Pt/Ta) systems.

When the region to the left of the isolation region 12 within the semiconductor structure of FIG. 3 is intended for further fabrication of an n-metal oxide semiconductor field effect transistor (i.e., an NFET), the first metal containing material layer 20 typically comprises a tantalum nitride material that has a work function of about 4.1 eV. The tantalum nitride material may be formed using methods including but not limited to thermal or plasma nitridation methods, chemical vapor deposition methods (including atomic layer chemical vapor deposition methods) and physical vapor deposition methods (including sputtering methods). The tantalum nitride material may comprise a stoichiometric tantalum nitride material. Alternatively, the tantalum nitride may deviate from a stoichiometric tantalum nitride material composition by up to about +/−30 atomic percent. Preferably, the first metal containing material layer 20 has a thickness from about 100 to about 400 angstroms.

The capping layer 22 is intended for protection of the first metal containing material layer 20 with respect to the second mask layer 23 located thereupon. The capping layer 22 may also provide etch stop properties. The capping layer 22 may comprise capping materials that are otherwise generally conventional in the semiconductor fabrication art. Generally, the capping layer 22 will comprise a dielectric capping material, although the embodiment is not so limited. Typically, the capping layer 22 comprises at least one of a silicon oxide material, a silicon nitride material and a silicon oxynitride material that has a thickness from about 50 to about 200 angstroms.

The second mask layer 23 is generally analogous to the first mask layer 16, but of lateral dimensions that leave uncovered the isolation region 12 and the right hand portion of the semiconductor substrate 10. In comparison with the first mask layer 16, the second mask layer 23 preferably also comprises a photoresist material, such as a positive photoresist material or a negative photoresist material. Typically, the second mask layer 23 has a thickness from about 1000 to about 5000 angstroms.

Figure 4:
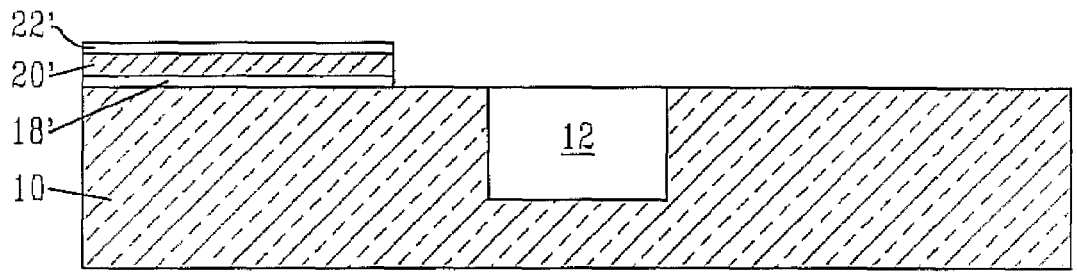

FIG. 4 shows the results of sequentially etching the capping layer 22, the first metal containing material layer 20 and the first gate dielectric 18 from the right hand side of the semiconductor structure whose schematic cross-sectional diagram is illustrated in FIG. 3, while using the second mask layer 23 as a mask. The result is a stack layer comprising a first gate dielectric 18', a first metal containing material 20' layer located upon the first gate dielectric 18' and a capping layer 22' located upon the first metal containing material layer 20'. FIG. 4 also shows the results of subsequently stripping the second mask layer 23 from the resulting foregoing stack layer.

The capping layer 22, the first metal containing material layer 20 and the first gate dielectric 18 may be etched to form the stack comprising the capping layer 22', the first metal containing material layer 20' and the first gate dielectric 18' while using etch methods that are conventional in the semiconductor fabrication art. Similarly with the etching of the sacrificial layer 14 that is illustrated in FIG. 1 to provide the sacrificial layer 14' that is illustrated in FIG. 2, the etching may use wet chemical etching methods and materials, as well as dry plasma etching methods and materials. Dry plasma etching methods and materials are generally preferred although, again, wet chemical etching methods and materials provide for inhibited physical and electrical damage to the right hand side of the semiconductor substrate 10.

Figure 5:
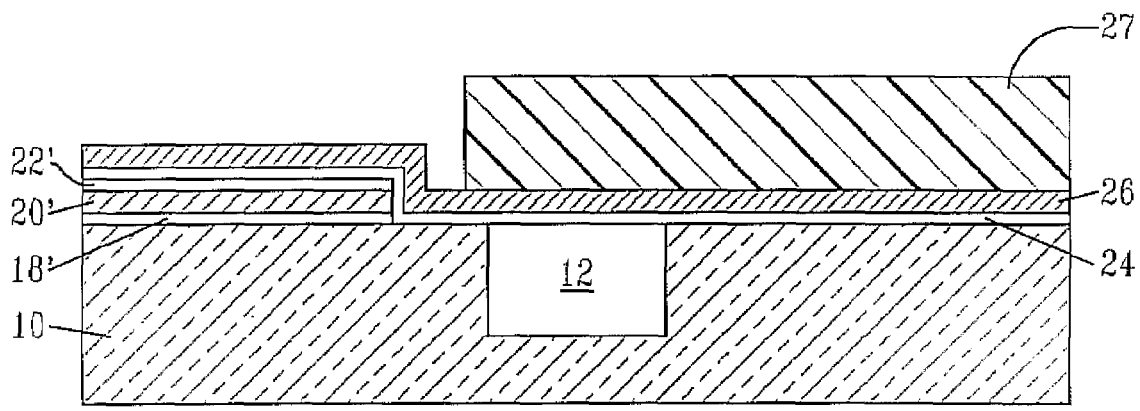

FIG. 5 shows a second gate dielectric 24 located and formed upon the semiconductor structure of FIG. 4. FIG. 5 also shows a second metal containing material layer 26 located and formed upon the second gate dielectric 24. FIG. 5 finally shows a third mask layer 27 located upon the second metal containing material layer 26 and covering a right hand portion of the second metal containing material layer 26.

The second gate dielectric 24 may comprise materials, have dimensions and be formed using methods that are analogous, equivalent or identical to the materials, dimensions and methods that are used for forming the first gate dielectric 18. The second gate dielectric 24 and the first gate dielectric 18 may comprise the same materials and thicknesses or different materials and thicknesses. Typically, the second gate dielectric 24 also comprises a hafnium oxide dielectric material that has a thickness from about 20 to about 50 angstroms. It is preferred that the second gate dielectric 24 is also comprised of an oxide, such as $SiO_2$, $HfO_2$, $ZrO_2$, $Al_2O_3$, $TiO_2$, $La_2O_3$, $SrTiO_3$, $LaAlO_3$, and mixtures thereof, that is not necessarily of the same composition or thickness as the first gate dielectric 18.

Figure 6:
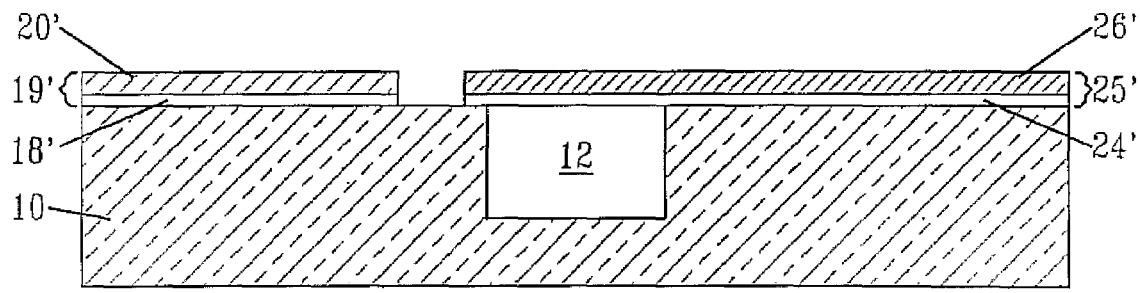

The second metal containing material layer 26 may comprise metal containing materials, have dimensions and be formed using methods that are also analogous, equivalent or identical to the materials, dimensions and methods that are used within the context of the first metal containing material layer 20. Alternatively, the foregoing materials, dimensions and methods may be different. However, in particular the second metal containing material layer 26 is selected to be formed of a metal containing material whose work function is optimized within the context of a metal oxide semiconductor field effect transistor desired to be fabricated within the right hand side of the semiconductor structure whose schematic cross-sectional diagram is illustrated in FIG. 6. Thus, the first metal containing material layer 20 and the second metal containing material layer 26 will typically not comprise, even in part, the same metal containing material.

Typically, the second metal containing material layer 26 comprises a tungsten nitride material that has a work function of about 5.2 eV when it is desired to fabricated a p-metal oxide semiconductor field effect transistor (e.g., pFET) within the right hand side of the semiconductor structure whose schematic cross-sectional diagram is illustrated in FIG. 6.

The third mask layer 27 may comprise mask materials, have thickness dimensions and be formed using methods that are analogous, equivalent or identical to the materials, thicknesses and methods that are used within the context of the second mask layer 23 that is illustrated in FIG. 3 and the first mask layer that is illustrated in FIG. 1. Typically, the third mask layer 27 comprises a positive or negative photoresist material that has a thickness from about 1000 to about 5000 angstroms.

FIG. 6 shows the results of sequentially etching the second metal containing material layer 26, the second gate dielectric 24 and the capping layer 22' to form a first stack 19' comprising: (1) a planar first gate dielectric 18'; and (2) a first metal containing material layer 20' located thereupon (i.e., which are implicitly intended as first precursor layers to a subsequently additionally patterned planar first gate dielectric 18" and first metal containing material layer 20", as claimed, and as is illustrated in FIG. 9), and further upon the left hand side of the semiconductor structure of FIG. 6. The etching also forms a second stack 25' comprising: (1) a planar second gate dielectric 24'; and (2) a second metal containing material layer 26' located thereupon (i.e., which are implicitly intended as second precursor layers to a subsequently additionally patterned planar second gate dielectric 24" and second metal containing material layer 26", as claimed, and as is illustrated in FIG. 9), and further upon the right hand side of the semiconductor structure of FIG. 6. Finally, FIG. 6 also shows the results of stripping the third mask layer 27 from the resulting semiconductor structure after the above described etching. As is illustrated in FIG. 6, the mask layer 27 is patterned and dimensioned so that after etching the second gate dielectric 24 and the second metal containing material layer 26 there is no overlap region between the first stack 19' and the second stack 25'. Such a lack of overlap is convenient for subsequent further etching of layers 18', 20', 24' and 26', as is illustrated within the context of FIG. 8 and FIG. 9.

Etching of the second metal containing material layer 26, the second gate dielectric 24 and the capping layer 22' to provide the foregoing first stack 19' separated from the foregoing second stack 25' with a portion of the semiconductor substrate 10 interposed therebetween may be effected using etch methods that are generally conventional in the semiconductor fabrication art. Again, plasma etch methods and materials, as well as wet chemical etch methods and materials, may be used, with wet chemical etch methods possibly providing an advantage of inhibited plasma induced damage to the semiconductor substrate 10.

Figure 7A:
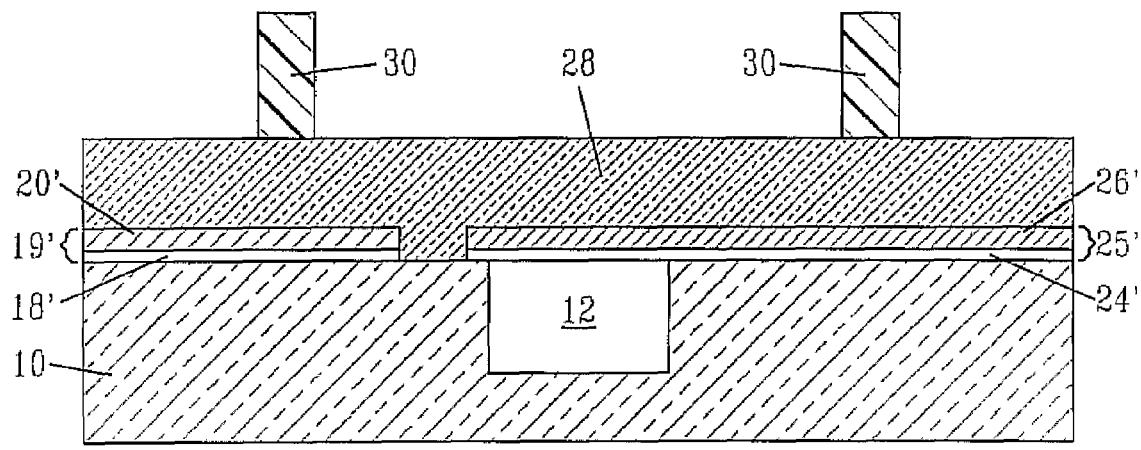

FIG. 7A shows a silicon containing material layer 28 located upon the semiconductor structure of FIG. 6. FIG. 7A also shows a pair of fourth mask layers 30 located upon the silicon containing material layer 28.

The silicon containing material layer 28 typically comprises a silicon containing material having a different composition than any portion of the semiconductor substrate 10 under circumstances where the first stack 19' and the second stack 25' do not overlap, but rather (as is illustrated in FIG. 6 and FIG. 7A) leave exposed a portion of the semiconductor substrate 10. Alternatively, as discussed further below within the context of FIG. 7B, a portion of the isolation region 12 may be exposed interposed between the first stack 19' and the second stack 25'. Typically, the silicon containing material layer 28 comprises a silicon-germanium alloy material (having from about 1 to about 20 atomic percent germanium) when the semiconductor substrate 10 comprises a silicon semiconductor material. A reverse of the foregoing ordering of material compositions for the semiconductor substrate 10 and the silicon containing material layer 28 is also in accordance with the embodiment. Similarly, alternative materials compositions are also in accordance with the embodiment. Generally, the silicon containing material layer 28 and both an n-FET region of the semiconductor substrate 10 and a p-FET region of the semiconductor substrate 10 will comprise different materials for proper etch selectivity within the context of further processing of the semiconductor structure of FIG. 7A.

Figure 7B:
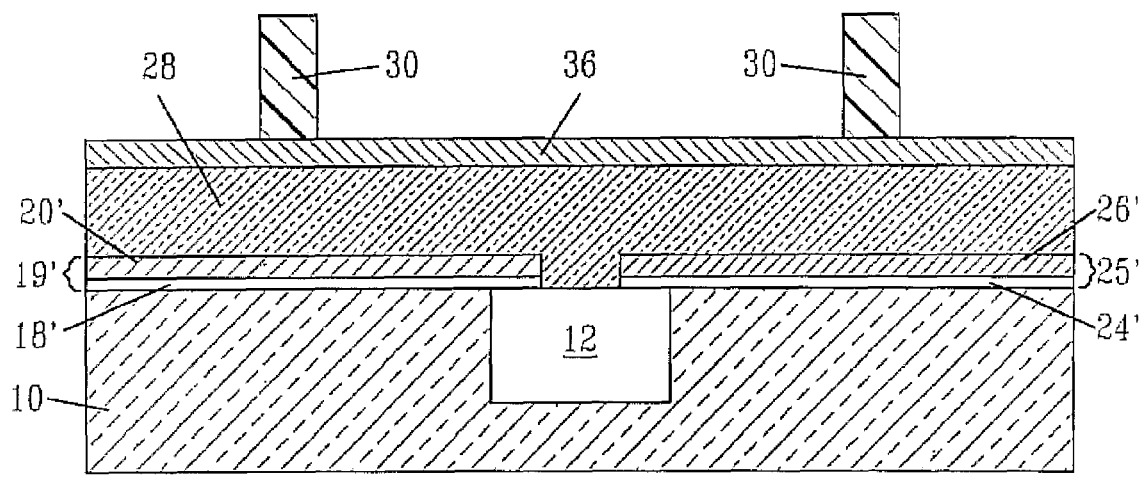

FIG. 7B shows a schematic cross-sectional diagram of a semiconductor structure related to the semiconductor structure of FIG. 7A, but wherein in a first instance the first stack 19' and the second stack 25' leave a gap over the isolation region 12 rather than the semiconductor substrate 10. FIG. 7B also shows a silicide material layer 36 located interposed between the fourth mask layers 30 and the silicon containing material layer 28. The silicide material layer 36 corresponds with a plurality of silicide layers 36' that are discussed further below within the context of FIG. 10. Further processing of either the semiconductor structure of FIG. 7A or the semiconductor structure of FIG. 7B will provide a semiconductor structure in accordance with the embodiment, although the resulting semiconductor structures are not necessarily identical. For clarity, further processing of the semiconductor structure of FIG. 7A is described as follows.

Figure 8:
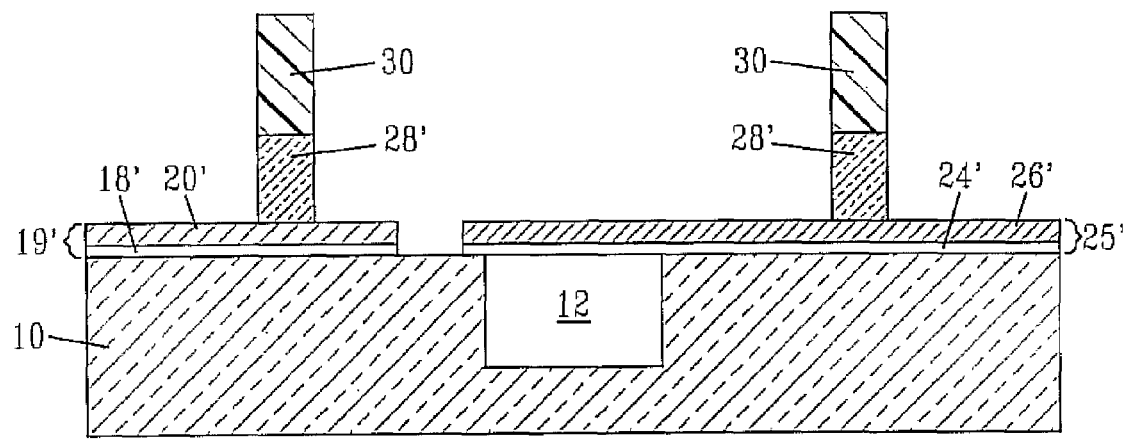
Figure 9:
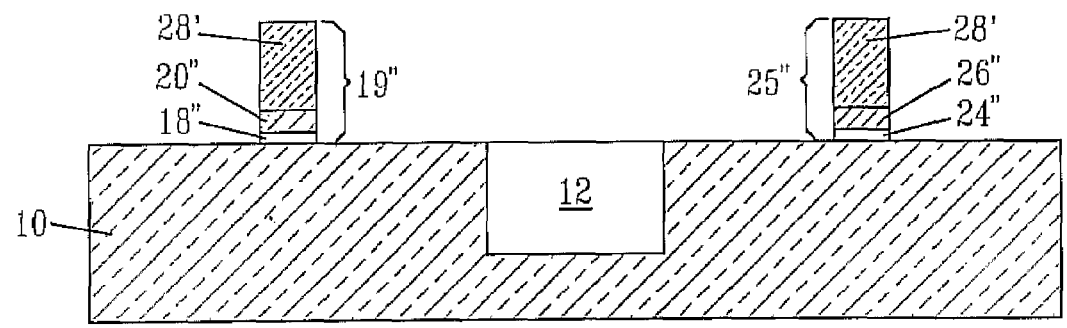

FIG. 8 shows the results of etching the silicon containing material layer 28 of FIG. 7A while using the fourth mask layers 30 as a mask, and the first stack 19', the second stack 25' and the semiconductor substrate 10 as an etch stop, to form a pair of silicon containing material layers 28'. The foregoing etching is typically effected while using a plasma etch method so that sidewalls of the silicon containing material layers 28' are straight, or nearly so. In order to provide specificity of etching of the silicon containing material layer 28 with respect to the semiconductor substrate 10 which are formed of different materials, the plasma etch method typically uses specific combinations of etchant gases such as CF4 and CHF3, along with appropriate diluent gases.

FIG. 9 shows the results of further etching the first stack 19' and the second stack 25' to form a first stack 19" and a second stack 25" that each also include a silicon containing material layer 28'. This further etching uses at least the silicon containing material layers 28' (and possibly also the fourth mask layers 30) as a mask. The etching follows generally continuously from the etching that is illustrated in FIG. 8. Again, both wet chemical etch methods and materials, and dry plasma etch methods and material, are common. Dry plasma etch methods and materials generally provide straight sidewalls when etching particular layers. Wet chemical etch methods and materials typically provide inhibited semiconductor substrate 10 damage.

After stripping the fourth mask layers 30, the first stack 19" comprises a first gate electrode stack and the second stack 25" comprises a second gate electrode stack within a pair of CMOS transistors desired to be fabricated within the semiconductor structure of FIG. 9.

Figure 10:
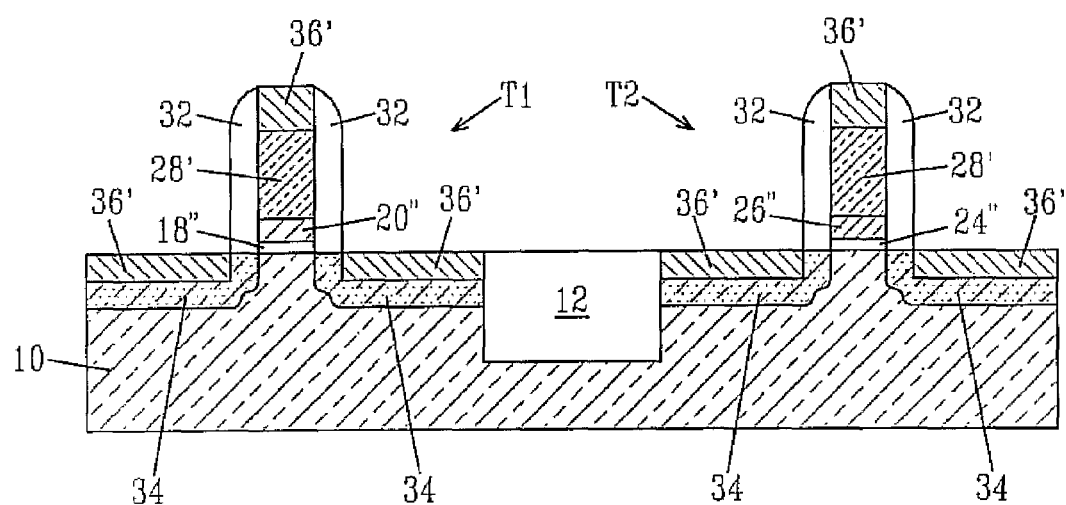

FIG. 10 shows the results of further processing of the semiconductor structure of FIG. 9. Specifically, FIG. 10 shows spacers 32 adjoining the first stack 19" and the second stack 25" that are illustrated within the schematic cross-sectional diagram of FIG. 9. FIG. 10 also shows a plurality of source/drain regions 34 located within the semiconductor substrate 10 and separated by the respective first stack 19" and second stack 25". FIG. 10 finally shows silicide layers 36' located upon the source/drain regions 34 and also upon the silicon containing material layers 28'.

The spacers 32, which are illustrated as plural layers with respect to the individual first stack 19" and second stack 25", are intended in plan-view as completely surrounding individual gate electrode stacks 19" and 25". The spacers 32 may be formed using methods and materials that are generally conventional in the semiconductor fabrication art. The spacers 32 may comprise conductor materials, semiconductor materials or dielectric materials. Spacers that comprise dielectric materials are most common. Spacers that comprise conductor materials or semiconductor materials are less common. Typically the spacers 32 are formed using a blanket layer deposition and an anisotropic etch back method that provides the spacers 32 with the characteristic inward pointed shape. Typically the spacers 32 comprise at least in part a silicon oxide material, often laminated with a silicon nitride material.

The source/drain regions 34 may similarly also be formed using methods that are conventional in the semiconductor fabrication art. The source/drain regions 34 are typically formed using a two step ion implantation method. A first step within the two step ion implantation method uses the stacks 19" and 25" absent the spacers 32 as a mask to form extension region portions into the semiconductor substrate 10. A second ion implantation process step uses the stacks 19" and 25" with the spacers 32 as a mask to form larger contact region portions of the source/drain regions 34 that incorporate the extension region portions of the source/drain regions 34. Typically, ion implant dopant doses within the first ion implant process step and the second ion implant process step yield dopant concentrations within the source/drain regions 34 from about $10^{19}$ to about $10^{21}$ dopant atoms per cubic centimeter. The first ion implant process step and the second ion implant process step need not necessarily use the same dopant dose, although under certain circumstances they might.

The silicide layers 36 may comprise any of several metal silicide forming metals. Candidate metal silicide forming metal materials include nickel, cobalt, titanium, tungsten, tantalum, platinum and vanadium metal silicide forming metals. Cobalt and nickel metal silicide forming metals are common. Typically, the metal silicide layers 36 are formed using a self aligned silicide (i.e., a salicide) method that uses a blanket metal silicide forming metal layer deposition, a subsequent thermal annealing and a subsequent stripping of unreacted metal silicide forming metal. Particular etchants to remove portions of unreacted metal silicide forming metal are selective to particular metal silicide forming metals. As is understood by a person skilled in the art, further processing of the semiconductor structure of FIG. 7B allows for different silicide layer 36' material compositions upon the gate electrode stacks 19" and 25" that are illustrated within FIG. 9, in comparison with the source/drain regions 34 that are illustrated in FIG. 10.

FIG. 10 shows a schematic cross-sectional diagram of a CMOS structure in accordance with a preferred embodiment of the invention. The CMOS structure includes a first transistor T1 fabricated within a first semiconductor substrate 10 region having a first polarity. The first transistor T1 comprises a first gate electrode comprising a first metal containing material layer 20" and a first silicon containing material layer 28' located thereupon. The CMOS structure also includes a second transistor T2 fabricated within a laterally separated second semiconductor substrate 10 region having a second polarity. The second transistor comprises a second gate electrode comprising a second metal containing material layer 26" and a second silicon containing material layer 28' located thereupon. Within the CMOS structure of the instant embodiment: (1) the first polarity is different than the second polarity; (2) the first metal containing material layer 20" comprises a first metal containing material composition that is different from a second metal containing material composition from which is comprised the second metal containing material layer 26"; and (3) the first silicon containing material layer 28' and the second silicon containing material layer 28' each respectively comprise a different material from the first semiconductor substrate 10 region and the second semiconductor substrate 10 region.

Since the first metal containing material layer 20" and the second metal containing material layer 26" comprise different metal containing materials, the embodiment provides an opportunity to individually engineer a work function for the first gate electrode within the first transistor T1 and the second gate electrode within the second transistor T2.

The foregoing embodiment is illustrative of the invention rather than limiting of the invention. Revisions and modifications may be made to methods, materials, structures and dimensions of a CMOS structure in accordance with the disclosed embodiment while still providing a CMOS structure in accordance with the invention, further in accordance with the accompanying claims.

What is claimed is:

1. A method for fabricating a CMOS structure comprising:
   forming over a first semiconductor substrate region having a first polarity within a semiconductor substrate a first gate dielectric and an overlying first gate electrode comprising a first metal containing material layer and a first silicon containing material layer located upon the first metal containing material layer;
   forming over a laterally separated second semiconductor substrate region having a second polarity different than the first polarity within the semiconductor substrate a second gate dielectric and an overlying second gate electrode laterally separated from the first gate electrode and comprising a second metal containing material layer of a composition that is different than the first metal containing material layer and a second silicon containing material layer located upon the second metal containing material layer, wherein the forming the first gate electrode and the forming the second gate electrode use a first precursor layer from which the first metal containing material layer is patterned and a second precursor layer from which the second metal containing material layer is patterned, the patterned first metal containing material layer and the patterned second metal containing material layer being separated by a gap over at least one of the first semiconductor substrate region and the second semiconductor substrate region; and
   forming into the first semiconductor substrate region and the second semiconductor substrate region a first pair of source/drain regions separated by the first gate electrode and a second pair of source/drain regions separated by the second gate electrode, where the first silicon containing material layer has a composition different than the first semiconductor substrate region and the second silicon containing material layer has a composition different than the second semiconductor substrate region.

2. The method of claim 1 wherein the first metal containing material layer and the second metal containing material layer comprise a metal containing material selected from the group consisting of metals, metal alloys and metal nitrides.

3. The method of claim 1 wherein the first metal containing material layer and the second metal containing material layer comprise a metal containing material selected from the group consisting of tungsten nitride, tantalum nitride, titanium/nickel (Ti/Ni), hafnium/molybdenum (Hf/Mo), ruthenium/tantalum (Ru/Ta) and platinum/tantalum (Pt/Ta) metal containing materials.

4. The method of claim 1 wherein:
   each of the first gate dielectric and the second gate dielectric is planar;
   each of the first silicon containing material layer and the second silicon containing material layer comprises one of a silicon material and a silicon-germanium alloy material; and
   each of the first semiconductor substrate region and the second semiconductor substrate region comprises the other of the silicon material and the silicon-germanium alloy material for etch selectivity purposes with respect to the first silicon containing material layer and the second silicon containing material layer.

5. The method of claim 1 wherein:
   each of the first gate dielectric and the second gate dielectric is planar;
   each of the first silicon containing material layer and the second silicon containing material layer consists of one of a silicon material and a silicon-germanium alloy material; and
   each of the first semiconductor substrate region and the second semiconductor substrate region consists of the other of the silicon material and the silicon-germanium alloy material for etch selectivity purposes with respect to the first silicon containing material layer and the second silicon containing material layer.

6. The method of claim 1 wherein forming the first gate electrode and forming the second gate electrode use a single silicon containing material layer located over a first precursor layer from which the first metal containing material layer is patterned that is laterally separated from a second precursor layer from which the second metal containing material layer is patterned.

7. The method of claim 6 wherein forming the first gate electrode and forming the second gate electrode simultaneously pattern the first silicon containing material layer and the second silicon containing material layer from the single silicon containing material layer.

8. A method for fabricating a CMOS structure comprising:
forming over a first semiconductor substrate region having a first polarity within a semiconductor substrate a first gate dielectric and an overlying first gate electrode comprising a first metal containing material layer and a first silicon containing material layer located upon the first metal containing material layer;
forming over a laterally separated second semiconductor substrate region having a second polarity different than the first polarity within the semiconductor substrate a second gate dielectric and an overlying second gate electrode laterally separated from the first gate electrode and comprising a second metal containing material layer of a composition that is different than the first metal containing material layer and a second silicon containing material layer located upon the second metal containing material layer wherein the forming the first gate electrode and the forming the second gate electrode use a first precursor layer from which the first metal containing material layer is patterned and a second precursor layer from which the second metal containing material layer is patterned, the patterned first metal containing material layer and the patterned second metal containing material layer being separated by a gap over an isolation region within the semiconductor substrate; and
forming into the first semiconductor substrate region and the second semiconductor substrate region a first pair of source/drain regions separated by the first gate electrode and a second pair of source/drain regions separated by the second gate electrode, where the first silicon containing material layer has a composition different than the first semiconductor substrate region and the second silicon containing material layer has a composition different than the second semiconductor substrate region.

9. The method of claim 8 wherein the first metal containing material layer and the second metal containing material layer comprise a metal containing material selected from the group consisting of metals, metal alloys and metal nitrides.

10. The method of claim 8 wherein the first metal containing material layer and the second metal containing material layer comprise a metal containing material selected from the group consisting of tungsten nitride, tantalum nitride, titanium/nickel (Ti/Ni), hathium/molybdenum (Hf/Mo), ruthenium/tantalum (Ru/Ta) and platinum/tantalum (Pt/Ta) metal containing materials.

11. The method of claim 8 wherein:
each of the first gate dielectric and the second gate dielectric is planar; each of the first silicon containing material layer and the second silicon containing material layer comprises one of a silicon material and a silicon-germanium alloy material; and
each of the first semiconductor substrate region and the second semiconductor substrate region comprises the other of the silicon material and the silicon-germanium alloy material for etch selectivity purposes with respect to the first silicon containing material layer arid the second silicon containing material layer.

12. The method of claim 8 wherein:
each of the first gate dielectric and the second gate dielectric is planar;
each of the first silicon containing material layer and the second silicon containing material layer consists of one of a silicon material and a silicon-germanium alloy material; and
each of the first semiconductor substrate region and the second semiconductor substrate region consists of the other of the silicon material and the silicon-germanium alloy material for etch selectivity purposes with respect to the first silicon containing material layer and the second silicon containing material layer.

13. The method of claim 8 wherein forming the first gate electrode and forming the second gate electrode use a single silicon containing material layer located over a first precursor layer from which the first metal containing material layer is patterned that is laterally separated from a second precursor layer from which the second metal containing material layer is patterned.

14. The method of claim 13 wherein forming the first gate electrode and forming the second gate electrode simultaneously pattern the first silicon containing material layer and the second silicon containing material layer from the single silicon containing material layer.

* * * * *